United States Patent
Kwon

(10) Patent No.: US 7,939,820 B2
(45) Date of Patent: May 10, 2011

(54) ORGANIC LIGHT EMITTING DISPLAY (OLED) AND ITS METHOD OF FABRICATION

(75) Inventor: Jung-Hyun Kwon, Suwon-si (KR)

(73) Assignee: Samsung Mobile Display Co., Ltd., Giheung-Gu, Yongin, Gyunggi-Do (KR)

( * ) Notice: Subject to any disclaimer, the term of this patent is extended or adjusted under 35 U.S.C. 154(b) by 408 days.

(21) Appl. No.: 11/905,380

(22) Filed: Sep. 28, 2007

(65) Prior Publication Data

US 2008/0128686 A1 Jun. 5, 2008

(30) Foreign Application Priority Data

Nov. 30, 2006 (KR) .................. 10-2006-0119898

(51) Int. Cl.
*H01L 29/08* (2006.01)
(52) U.S. Cl. .......................... 257/40; 438/99
(58) Field of Classification Search .......... 257/40; 438/99
See application file for complete search history.

(56) References Cited

U.S. PATENT DOCUMENTS

| | | | |
|---|---|---|---|
| 2005/0046342 A1* | 3/2005 | Park et al. ............ | 313/504 |
| 2005/0082534 A1* | 4/2005 | Kim et al. ............ | 257/72 |
| 2006/0082284 A1* | 4/2006 | Shibusawa ............ | 313/500 |
| 2008/0218058 A1* | 9/2008 | Son ............ | 313/500 |

FOREIGN PATENT DOCUMENTS

| | | |
|---|---|---|
| KR | 10-2003-0008904 | 1/2003 |
| KR | 10-2003-0014928 | 2/2003 |
| KR | 10-2004-0102654 | 12/2004 |
| KR | 10-2005-0028561 | 3/2005 |
| KR | 10-2006-0007771 | 1/2006 |
| KR | 10-2006-0057946 | 5/2006 |

OTHER PUBLICATIONS

*Notice of Allowability* from the Korean Intellectual Property Office issued in Applicant's corresponding Korean Patent Application No. 10-2006-0119898 dated Dec. 31, 2007.
Korean Office action for Korean Patent App. No. 10-2006-0119898 mailed on Jul. 30, 2007.
*Office action* from the Korean Intellectual Property Office issued in Applicant's corresponding Korean Patent Application No. 10-2006-0119898 dated Jul. 30, 2007.

* cited by examiner

*Primary Examiner* — Wai-Sing Louie
*Assistant Examiner* — Bilkis Jahan
(74) *Attorney, Agent, or Firm* — Robert E. Bushnell, Esq.

(57) ABSTRACT

An Organic Light Emitting Display (OLED) and its method of fabrication, is capable of omitting a process of patterning a second pixel electrode by forming a first pixel electrode, forming a pixel-defining layer including an opening on the first pixel electrode, and forming the second pixel electrode and a third pixel electrode in the opening using a shadow mask as a mask. The OLED includes: a substrate; a first pixel electrode disposed on the substrate; a pixel-defining layer having an opening exposing a portion of the first pixel electrode; a second pixel electrode disposed on the first pixel electrode exposed by the opening of the pixel-defining layer and disposed in the opening of the pixel-defining layer; a third pixel electrode disposed on the second pixel electrode and disposed in the opening of the pixel-defining layer; an organic layer disposed on the third pixel electrode and including an emission layer; and an opposite electrode disposed on the organic layer.

13 Claims, 7 Drawing Sheets

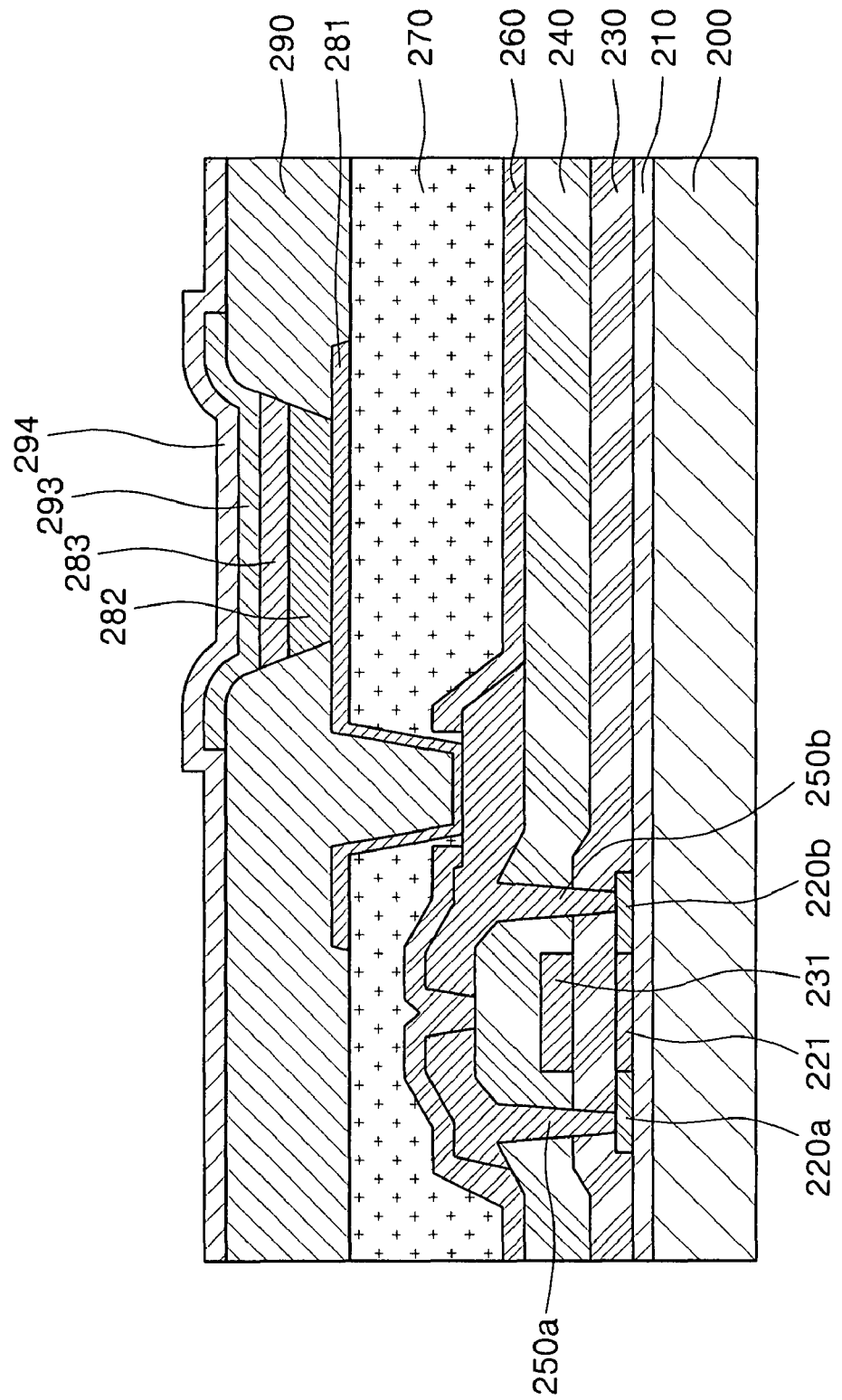

ORGANIC LIGHT EMITTING DISPLAY (OLED) AND ITS METHOD OF FABRICATION

CLAIM OF PRIORITY

This application makes reference to, incorporates the same herein, and claims all benefits accruing under 35 U.S.C. §119 from an application for ORGANIC LIGHT EMITTING DISPLAY DEVICE AND METHOD OF FABRICATING THE SAME earlier filed in the Korean Intellectual Property Office on 30 Nov. 2006 and there duly assigned Serial No. 2006-119898.

BACKGROUND OF THE INVENTION

1. Field of the Invention

The present invention relates to an Organic Light Emitting Display (OLED) and its method of fabrication, and more particularly, the present invention relates to an OLED and its method of fabrication, capable of omitting a process of patterning a second pixel electrode by forming a first pixel electrode, forming a pixel-defining layer including an opening on the first pixel electrode, and forming the second pixel electrode and a third pixel electrode in the opening using a shadow mask as a mask.

2. Description of the Related Art

In general, an organic light emitting diode has a structure in which an organic thin layer is disposed between a first electrode (an anode) which is a transparent electrode formed of ITO and a second electrode (a cathode) formed of a metal having a low work function, such as Ca, Li, Al, and so on. When a forward voltage is supplied to the organic light emitting diode, a hole and an electron are injected into the organic layer, the hole and electron injected into the organic thin layer are re-combined with each other to generate an exciton, and the exciton transitions from an excited state to a ground state to thereby emit light.

The first electrode is formed as a reflective electrode for reflecting light, and the second is formed as a transmissive electrode for transmitting light, thereby forming an organic light emitting diode capable of emitting light emitted from the organic thin layer in a direction of the second electrode.

FIG. 1 is a cross-sectional view showing a method of fabricating an OLED.

Referring to FIG. 1, a buffer layer 110 is formed on a substrate 100, a semiconductor layer composed of source and drain regions 120a and 120b and a channel region 121 is formed on the buffer layer 110, a gate electrode 131 is formed on a gate insulating layer 130, and source and drain electrodes 150a and 150b are formed on an interlayer insulating layer and electrically connected to the source and drain regions 120a and 120b through contact holes.

An organic light emitting diode is formed on the substrate 100. The organic light emitting diode includes: a first electrode 180 acting as an anode electrically connected to the drain electrode 150b through a via-hole and formed on a passivation layer 160 and a planarization layer 170 which are formed over a thin film transistor; an organic layer 191 formed on the first electrode 180 exposed through an opening in a pixel-defining layer 190; and a second electrode 192 formed on the organic layer 191.

The first electrode 180 is formed of an Indium Tin Oxide (ITO) layer 180a, an Ag layer 180b is formed on the ITO layer 180a, and an ITO layer 180c is formed on the Ag layer 180b. Then, a photoresist pattern is formed on the ITO layer 180c, and the first electrode layer having a deposited structure of the ITO layer/Ag layer/ITO layer is etched using the photoresist pattern as a mask, thereby forming the first electrode 180 having a deposited structure of the ITO layer/Ag layer/ITO layer. Then, the photoresist pattern is removed using a stripping solution, and the substrate having the first electrode is cleaned.

In this process, the etching process may be a wet etching or dry etching process. In the case of the wet etching, an acidic solution, such as H3PO4, CH3COOH, HNO3, H2SO4, and so on, or a mixture thereof is supplied or injected onto a region to be etched to obtain a desired pattern. A strong basic solution is needed in a cleaning or stripping process after the etching.

However, since the strong acidic or basic chemicals used in the etching, cleaning and stripping processes are in direct contact with the ITO layer 180a and the Ag layer 180b used as the pixel electrode 180, a metal oxide layer is formed due to oxidation of Ag at an interface between the ITO layer 180a and the Ag layer 180b, and thus adhesion between the lower ITO layer and the Ag layer may be weakened to cause the Ag layer to be peeled-off from the lower ITO layer during the process.

SUMMARY OF THE INVENTION

The present invention provides an Organic Light Emitting Display (OLED) and its method of fabrication, capable of omitting a process of patterning a second pixel electrode so as not to generate a metal oxide layer, which may be formed between a first pixel electrode and the second pixel electrode due to oxidation of the second pixel electrode, and preventing adhesion between the first and second pixel electrodes from being weakened due to the metal oxide layer to thereby prevent peeling-off thereof.

According to one aspect of the present invention, an Organic Light Emitting Display (OLED) is provided including: a substrate; a first pixel electrode arranged on the substrate; a pixel-defining layer having an opening exposing a portion of the first pixel electrode; a second pixel electrode arranged on the first pixel electrode exposed by the opening of the pixel-defining layer and arranged in the opening of the pixel-defining layer; a third pixel electrode arranged on the second pixel electrode and arranged in the opening of the pixel-defining layer; an organic layer arranged on the third pixel electrode and including an emission layer; and an opposite electrode arranged on the organic layer.

The first pixel electrode preferably includes a material selected from a group consisting of Indium Tin Oxide (Ito), Indium Zinc Oxide (IZO), Tin Oxide (TO), and Zinc Oxide (ZnO).

The second pixel electrode preferably includes a material selected from a group consisting of Al, an Al alloy, Ag, and an Ag alloy.

The third pixel electrode preferably includes a material selected from a group consisting of Indium Tin Oxide (ITO), Indium Zinc Oxide (IZO), Tin Oxide (TO), and Zinc Oxide (ZnO).

The first pixel electrode preferably has a thickness in a range of 50-100 Å.

The second pixel electrode preferably has a thickness in a range of 900-2000 Å.

The third pixel electrode preferably has a thickness in a range of 50-100 Å.

The pixel-defining layer preferably includes a material selected from a group consisting of benzocyclobutene (BCB), acryl-based photoresist, phenol-based photoresist, and polyimide-based photoresist.

According to another aspect of the present invention, an Organic Light Emitting Display (OLED) is provided including: a substrate; a thin film transistor including a semiconductor layer having source and drain regions arranged on the substrate, and source and drain electrodes electrically connected to the semiconductor layer; a first pixel electrode connected to one of the source and drain electrodes; a pixel-defining layer having an opening exposing a portion of the first pixel electrode; a second pixel electrode arranged on the first pixel electrode exposed by the opening of the pixel-defining layer and arranged in the opening of the pixel-defining layer; a third pixel electrode arranged on the second pixel electrode and arranged in the opening of the pixel-defining layer; an organic layer arranged on the third pixel electrode and including an emission layer; and an opposite electrode arranged on the organic layer.

The first pixel electrode preferably includes a material selected from a group consisting of Indium Tin Oxide (ITO), Indium Zinc Oxide (IZO), Tin Oxide (TO), and Zinc Oxide (ZnO).

The second pixel electrode preferably includes a material selected from a group consisting of Al, an Al alloy, Ag, and an Ag alloy.

The third pixel electrode preferably includes a material selected from a group consisting of Indium Tin Oxide (ITO), Indium Zinc Oxide (IZO), Tin Oxide (TO), and Zinc Oxide (ZnO).

The pixel-defining layer preferably includes a material selected from a group consisting of benzocyclobutene (BCB), acryl-based photoresist, phenol-based photoresist, and polyimide-based photoresist.

According to still another aspect of the present invention, a method of fabricating an Organic Light Emitting Display (OLED) is provided including: forming a thin film transistor including a semiconductor layer, a gate electrode, and source and drain electrodes on a substrate; forming a passivation layer on an entire surface of the substrate including the thin film transistor; etching the passivation layer to form a contact hole exposing one of the source and drain electrodes; forming a first pixel electrode arranged on the passivation layer and connected to one of the source and drain electrodes through the contact hole; forming a pixel-defining layer on the first pixel electrode, the pixel-defining layer having an opening exposing a portion of the first pixel electrode; forming a second pixel electrode arranged on the first pixel electrode exposed by the opening of the pixel-defining layer, the second pixel electrode arranged in the opening of the pixel-defining layer; and forming a third pixel electrode arranged on the second pixel electrode, the third pixel electrode arranged in the opening of the pixel-defining layer.

The second pixel electrode and the third pixel electrode are preferably formed in the opening of the pixel-defining layer using a shadow mask.

The shadow mask used to form the second pixel electrode and the third pixel electrode is preferably the same mask used to form the opening of the pixel-defining layer.

BRIEF DESCRIPTION OF THE DRAWINGS

A more complete appreciation of the present invention and many of the attendant advantages thereof, will be readily apparent as the present invention becomes better understood by reference to the following detailed description when considered in conjunction with the accompanying drawings in which like reference symbols indicate the same or similar components, wherein:

FIGS. 3A to 3E are cross-sectional views of a method of fabricating an OLED in accordance with an exemplary embodiment of the present invention.

DETAILED DESCRIPTION OF THE INVENTION

Figure 1:
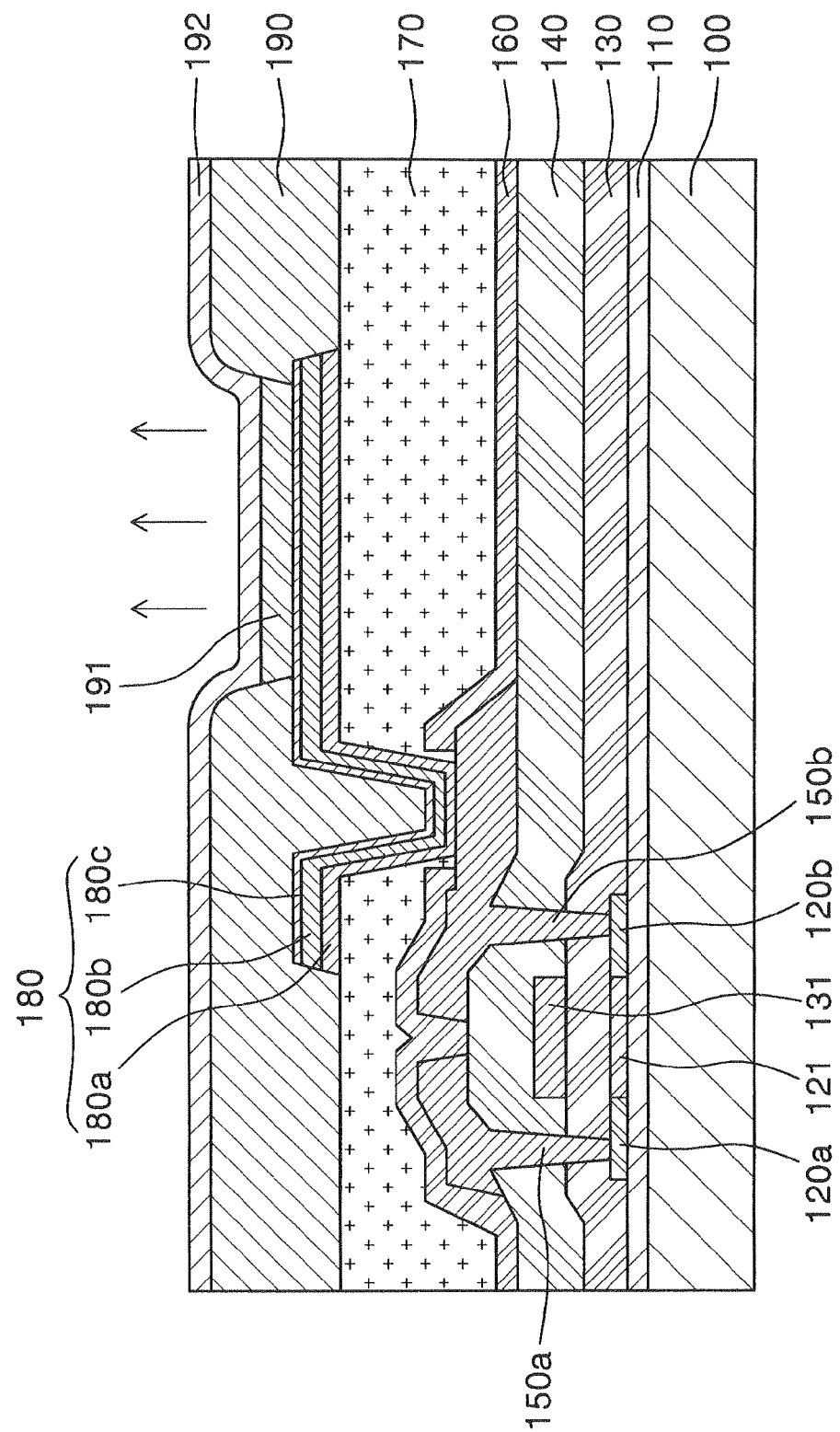
FIG. 1 is a cross-sectional view showing a method of fabricating an Organic Light Emitting Display (OLED)

The present invention is described more fully hereinafter with reference to the accompanying drawings, in which exemplary embodiments of the present invention are shown. In the drawings, the thickness of layers and regions are exaggerated for clarity. Like numbers refer to like elements throughout the specification.

Figure 2:
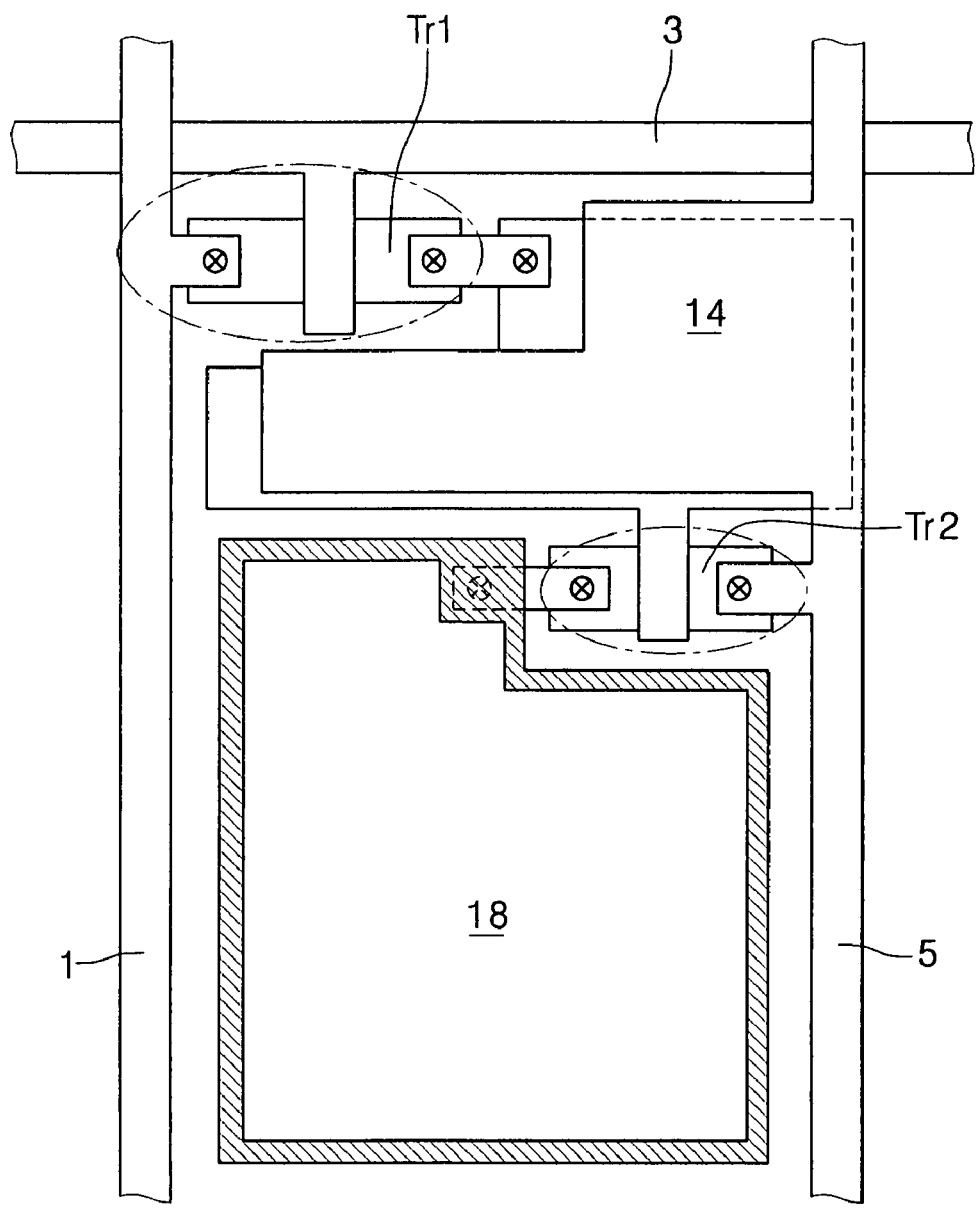
FIG. 2 is a plan view of a unit pixel of an OLED.

FIG. 2 is a plan view of a unit pixel of an OLED.

Referring to FIG. 2, a unit pixel includes a switching thin film transistor Tr1, a drive thin film transistor Tr2, a capacitor 14, and an organic light emitting diode 18 to thereby emit light in response to a signal. In addition, a gate line 3, a data line 1, and a power supply line 5 are connected to each device.

The switching thin film transistor Tr1 is driven in response to a scan signal supplied to the gate line 3, and functions to transmit a data signal supplied to the data line 1 to the drive thin film transistor Tr2.

The drive thin film transistor Tr2 determines an amount of current flowing through the organic light emitting diode 18 using a voltage difference between the data signal transmitted from the switching transistor Tr1 and a signal transmitted from the power supply line 5, i.e., a gate and a source.

In addition, the capacitor 14 functions to store the data signal transmitted through the switching transistor Tr1 for one frame.

FIGS. 3A to 3E are cross-sectional views of a method of fabricating an OLED in accordance with an exemplary embodiment of the present invention.

Figure 3A:
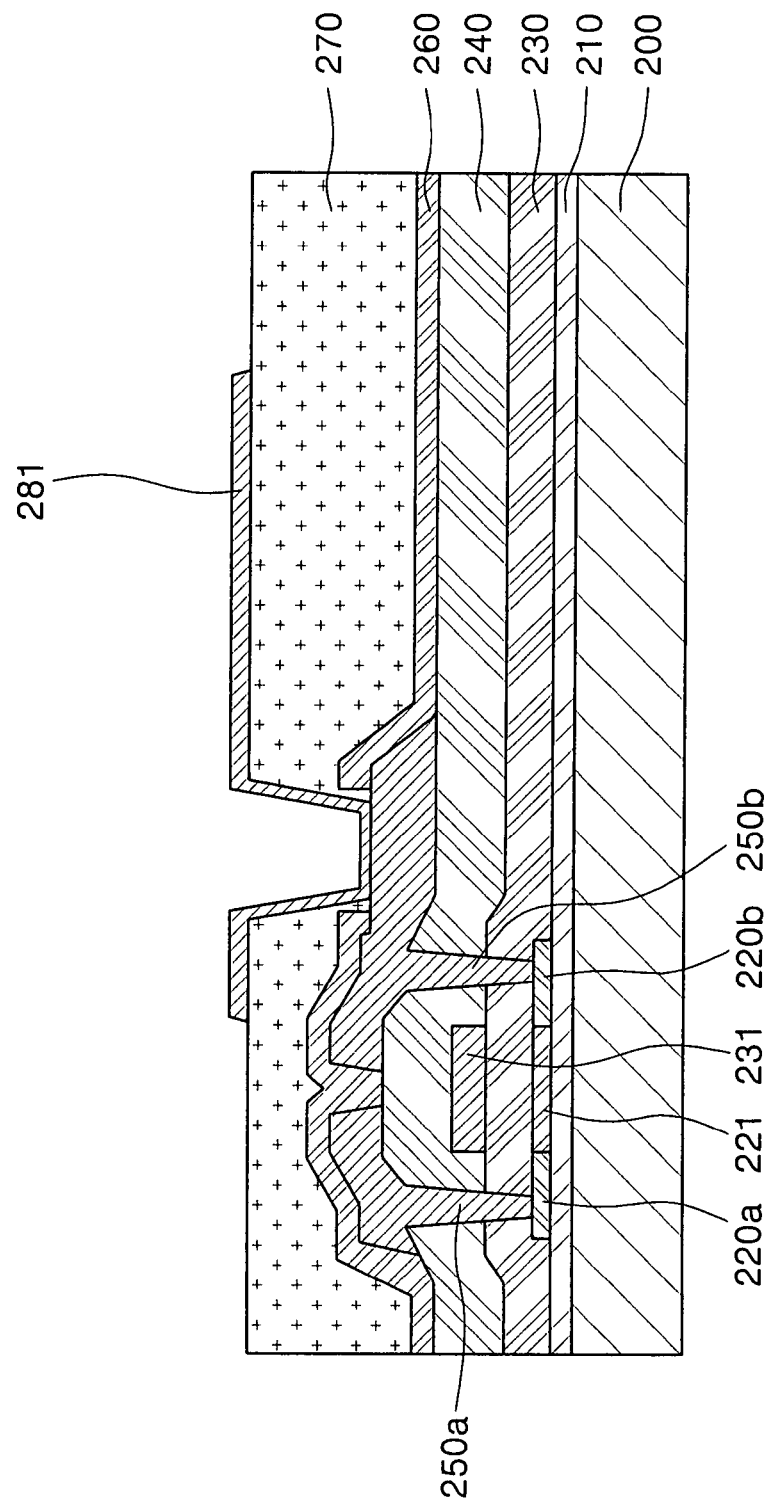

Referring to FIG. 3A, a silicon oxide layer is deposited on the entire surface of a transparent insulating substrate 200 to form a predetermined thickness of buffer layer 210 using a Plasma-Enhanced Chemical Vapor Deposition (PECVD) method. The buffer layer 210 prevents diffusion of impurities into the transparent insulating substrate 200 during a crystallization process of an amorphous silicon layer formed by the following process.

An amorphous silicon layer (not shown), that is, a semiconductor layer, is formed on the buffer layer 210 to a predetermined thickness. Then, the amorphous silicon layer is crystallized using a method, such as Excimer Laser Annealing (Ela), Sequential Lateral Solidification (SLS), Metal Induced Crystallization (MIC), Metal Induced Lateral Crystallization (MILC), etc., and then patterned by a photolithography process to form a semiconductor layer pattern in a unit pixel.

A gate insulating layer 230 is formed on the entire surface of the substrate including the semiconductor layer pattern. The gate insulating layer 230 may be formed of a silicon dioxide ($SiO_2$) layer, a silicon nitride (SiNx) layer, or a combination thereof.

A gate electrode 231 is formed in a certain region corresponding to a channel region 221 of the semiconductor layer pattern on the gate insulating layer 230. The gate electrode 231 may be formed of a metal selected from a group consisting of aluminum (Al), an aluminum alloy (Al alloy), molybdenum (Mo), and a molybdenum alloy (Mo alloy).

Then, impurities are ion-implanted into the semiconductor layer pattern 220 to form source and drain regions 220a and 220b using the gate electrode 231 as an ion implantation mask. The ion implantation process is performed using n+ or p+ impurities as a dopant.

Next, a predetermined thickness of interlayer insulating layer 240 is formed on the entire surface. The interlayer insulating layer 240 may be formed of a silicon dioxide (SiO$_2$) layer, a silicon nitride (SiNx) layer, or a combination thereof.

Then, the interlayer insulating layer 240 and the gate insulating layer 230 are etched by a photolithography process to form contact holes exposing the source and drain regions 220a and 220b.

Next, source and drain electrode materials are formed on the entire surface of the substrate including the contact holes, and the source and drain electrode materials are etched by a photolithography process to form source and drain electrodes 250a and 250b connected to the source and drain regions 220a and 220b. The source and drain electrodes 250a and 250b may be a single layer formed of a material selected from a group consisting of Mo, W, MoW, AlNd, Ti, Al, an Al alloy, Ag, an Ag alloy, etc., or a multi-layer formed of Mo, Al or Ag functioning as a resistance material to reduce the interconnection resistance, i.e., a deposition structure selected from the group consisting of Mo/Al/Mo, MoW/Al—Nd/MoW, Ti/Al/Ti, Mo/Ag/Mo, Mo/Ag-alloy/Mo, and so on.

An insulating layer is disposed on the source and drain electrodes 250a and 250b. The insulating layer may be an inorganic layer 260, an organic layer 270, or a combination thereof. In addition, a first pixel electrode 281 connected to the drain electrode 250b through a via-hole in the insulating layer is disposed on the insulating layer 281.

The first pixel electrode 281 may be formed of a material selected from a group consisting of Indium Tin Oxide (ITO), Indium Zinc Oxide (IZO), Tin Oxide (TO), and Zinc Oxide (ZnO). The pixel electrode may be formed of a single layer having a thickness of more than 1000 Å, but the first pixel electrode 281 of the present invention may be formed to have a thickness of 50-100 Å. When the first pixel electrode 281 has a thickness smaller than 50 Å, it is difficult to obtain uniformity, and when the first pixel electrode 281 has a thickness larger than 100 Å, adhesion of the first pixel electrode 281 may be weakened due to its own stress.

The first pixel electrode 281 may be etched by a wet etching method using phosphoric acid, nitric acid, hydrochloric acid, acetic acid, or a mixture thereof as an etchant. Since the substrate is etched when only the first pixel electrode has been formed, even though the first pixel electrode is exposed to an electrolyte solution used during the wet etching process, there is no galvanic effect.

The galvanic effect refers to a phenomenon in which current flows between two adjacent dissimilar metals because of a voltage generated by a potential difference between the metals, thereby producing electricity therein. In the two dissimilar metals coming into electrical contact with each other in this way, one metal having high activity (i.e., with low potential) acts as a positive electrode, and the other metal having relatively low activity (i.e., with high potential) acts as a negative electrode by a difference of work functions at an interface of the dissimilar metals. When the two metals are exposed to a corrosive solution, the two metals are corroded due to the potential difference between the two metals. This phenomenon is called "Galvanic Corrosion" and, in the galvanic corrosion, the positive electrode having the high activity is corroded more rapidly than when it is used by itself, and the negative electrode having the low activity is corroded at a relatively slow speed.

While the galvanic corrosion effect in the conventional organic light emitting diode has unstable resistance distribution due to an increase in contact resistance between electrodes, since the substrate of the present invention is etched after forming only the first pixel electrode, there is no galvanic corrosion even though only the first pixel electrode is exposed to an electrolyte solution used during the wet etching process.

Figure 3B:
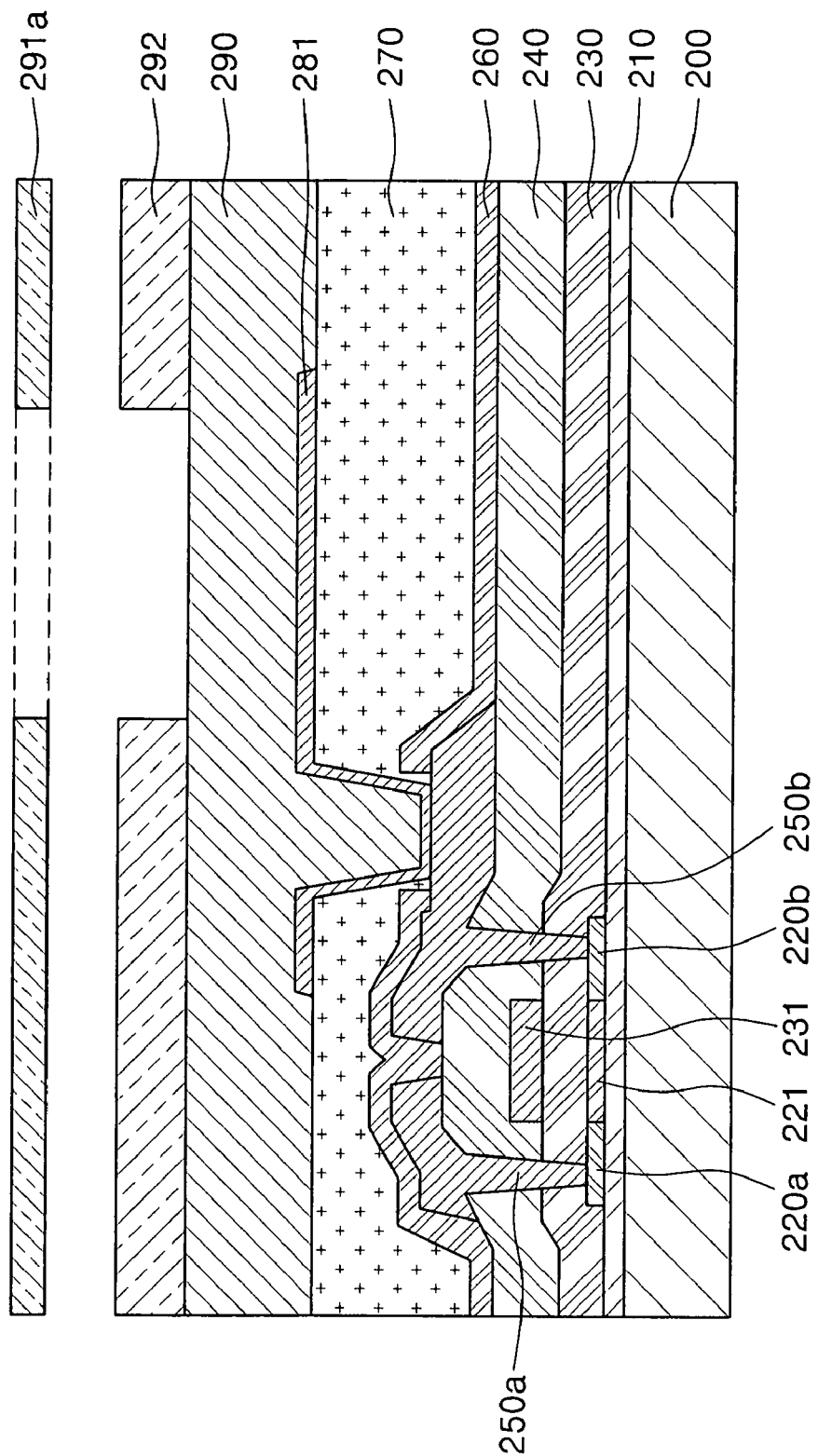

Referring to FIG. 3B, a pixel-defining layer 290 is formed on the first pixel electrode 281. Then, a photoresist layer (not shown) is formed on the pixel-defining layer 290, and the photoresist layer is exposed and developed using a shadow mask 291a to form a photoresist pattern 292.

Figure 3C:
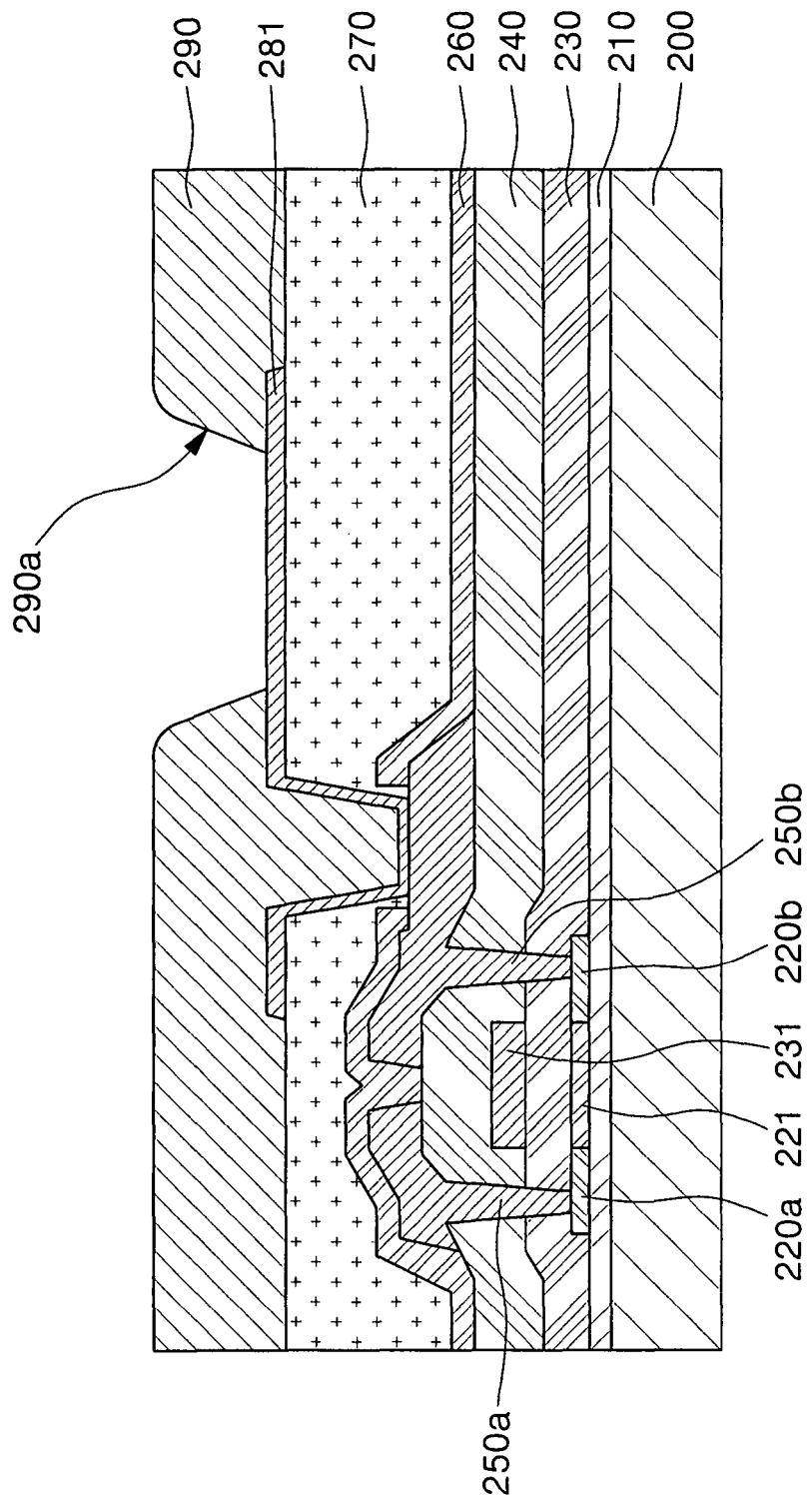

Referring to FIG. 3C, an opening 290a exposing a predetermined region of the first pixel electrode 281 and defining an emission region is formed in the pixel-defining layer 290 using the photoresist pattern 292 as a mask. The pixel-defining layer 290 may be formed of a material selected from a group consisting of benzocyclobutene (BCB), acryl-based photoresist, phenol-based photoresist, and polyimide-based photoresist.

Figure 3D:
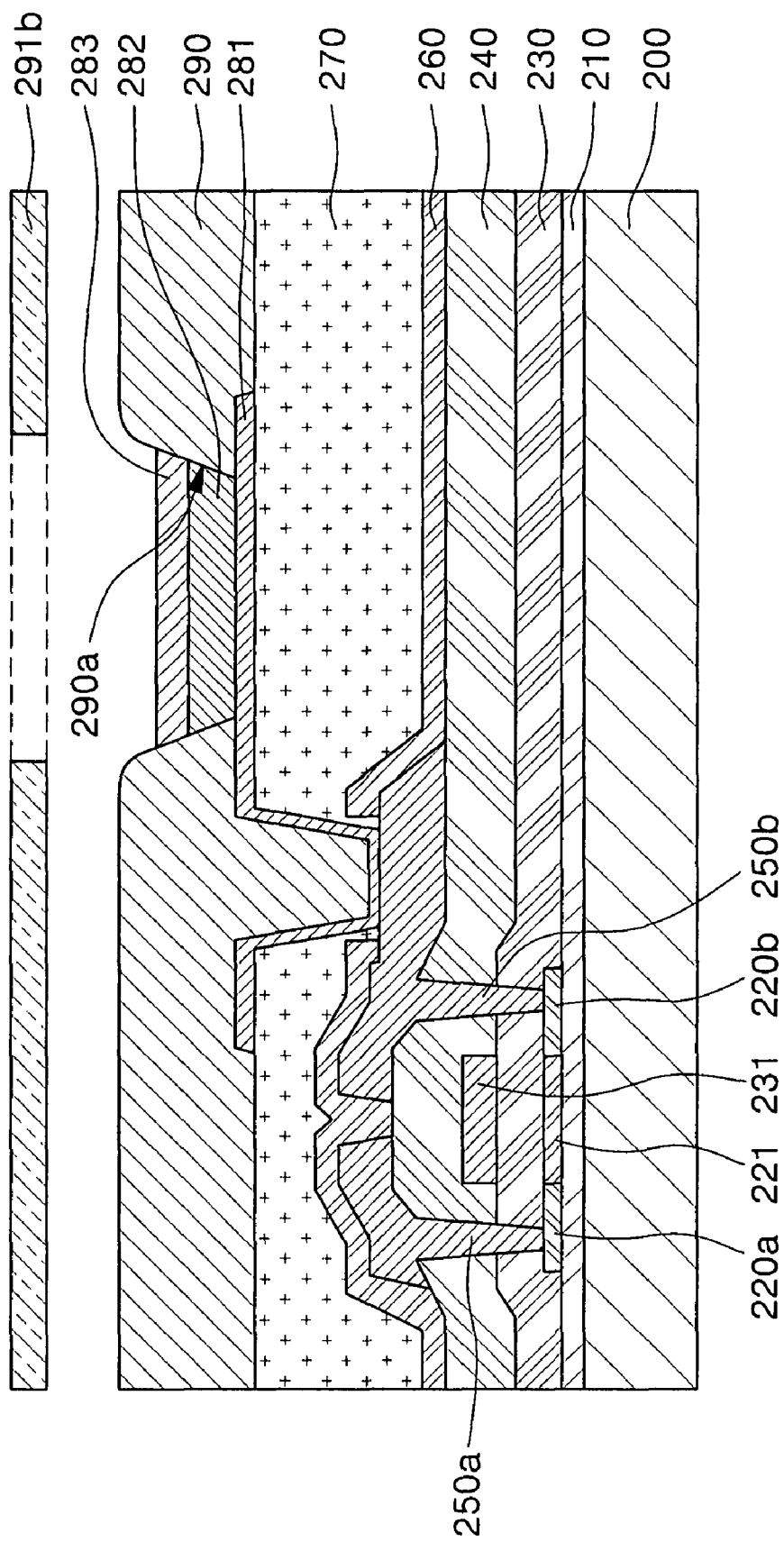

Referring to FIG. 3D, a second pixel electrode 282 disposed on the first pixel electrode 281 exposed by the opening 290a of the pixel-defining layer 290 and disposed in the opening 290a of the pixel-defining layer 290 is formed using the shadow mask 291b as a mask.

The second pixel electrode 282 may be formed of a material selected from a group consisting of Al, an Al alloy, Ag, and an Ag alloy. The second pixel electrode 282 may be formed to a thickness of 900-2000 Å. When the second pixel electrode 282 is thinner than 900 Å, light may be partially transmitted, and about 1000 Å is a minimum thickness in which light cannot be transmitted. When the second pixel electrode 282 is thicker than 2000 Å, it may not be preferable in manufacturing cost and process time.

The second pixel electrode 282 may function to reflect light to increase brightness and optical efficiency.

Then, a third pixel electrode 283 disposed on the second pixel electrode 282 and disposed in the opening 290a of the pixel-defining layer 290 is formed using the shadow mask 291b as a mask.

The third pixel electrode 283 may be formed of a material selected from a group consisting of Indium Tin Oxide (ITO), Indium Zinc Oxide (IZO), Tin Oxide (TO), and Zinc Oxide (ZnO). The third pixel electrode 283 may be formed to a thickness of 50-100 Å. When the third pixel electrode 283 is thinner than 50 Å, it is difficult to obtain uniformity of a thin layer, and when is thicker than 100 Å, reflectivity in a blue region may be lowered by 10-15% due to an interference effect.

The second pixel electrode 282 and the third pixel electrode 283 may be formed by a Physical Vapor Deposition (PVD) method, and so on.

The PVD method is a method of supplying energy to a substrate or mass formed of a desired thin layer material to physically separate a corresponding material having kinetic energy, thereby depositing the material on another substrate to form a thin layer. The PVD method may be classified into a sputtering method and an evaporation method.

The sputtering method is a method of colliding high-energy particles with a substrate formed of the same material as a desired thin layer to separate atoms and molecules therefrom, thereby forming a thin layer. The evaporation method is a method of heating a material to be deposited in a vacuum vessel to increase a vapor pressure, thereby depositing the material on the substrate. The second pixel electrode and the third pixel electrode may be formed by the PVD method.

The second pixel electrode and the third pixel electrode may be formed using the shadow mask 291b. The shadow mask 291b may be the shadow mask 291a used to form the opening of the pixel-defining layer.

Specifically, the second pixel electrode disposed on the first pixel electrode exposed by the opening of the pixel-defining layer and disposed in the opening of the pixel-defining layer is formed using the shadow mask 291a as a mask, and the third pixel electrode disposed on the second pixel electrode and disposed in the opening of the pixel-defining layer is formed, without using a separate shadow mask.

As described above, in the OLED in accordance with the present invention, after forming a first pixel electrode, a pixel-defining layer is formed on the first pixel electrode. Then, a certain region of the first pixel electrode is exposed on the pixel-defining layer, and a second pixel electrode and a third pixel electrode are formed in an opening exposing the certain region of the first pixel electrode using a shadow mask. Therefore, the OLED in accordance with the present invention excludes a process of patterning a pixel electrode, i.e., a process of patterning the first pixel electrode, the second pixel electrode, and the third pixel electrode, and then etching the electrodes using a photoresist pattern to firm the pixel electrode. As a result, the second pixel electrode is not exposed to strong acidic and strong basic chemicals used in etching, stripping and cleaning processes. Therefore, it is possible to prevent generation of a metal oxide layer at an interface between the first and second pixel electrodes due to oxidation of the second pixel electrode. In addition, it is possible to solve a problem that adhesion between the first and second pixel electrodes is weakened due to the conventional metal oxide layer and prevent peeling-off.

Referring to FIG. 3E, an organic layer 293 disposed on the third pixel electrode 283 and including an emission layer is formed, and then an opposite electrode 294 is formed on the organic layer 293.

The organic layer 293 includes an emission layer, and may further include at least one of a hole injection layer, a hole transport layer, an electron transport layer, and an electron injection layer.

The hole transport layer may be formed of a hole transport material, such as N,N'-di(naphthalene-1-yl)-N,N'-diphenyl-benzidine (a-NPB), N,N'-bis(3-methylphenyl)-N,N'-diphenyl-[1,1'-biphenyl]-4,4'-diamine (TPD), etc. In addition, the hole transport layer may be formed to a thickness of 10-50 nm. When the hole transport layer is smaller or larger than 10-50 nm, the hole transport performance may be lowered.

The hole transport layer may further include a dopant capable of emitting light through electron-hole combination, in addition to the hole transport material. The dopant may be 4-(dicyanomethylene)-2-t-butyl-6-(1,1,7,7-teramethylju-lolidyl-9-enyl)-4H-pyan (DCJTB), Coumarin 6, Rubrene, DCM, Perylene, Quinacridone, etc. The dopant is present in an amount of about 0.1-about 5 wt % of the total weight of the hole transport material. When a dopant is added in forming the hole transport layer, it is possible to adjust an emission color according to the kind and amount of the dopant, and improve the thermal stability of the hole transport layer, thereby increasing lifespan of the device.

In addition, the hole injection layer may be formed of a starbust amine-based compound to have a thickness of 30-100 nm. If the hole injection layer is smaller or larger than 30-100 nm, then the hole injection performance may be lowered. The hole injection layer reduces a contact resistance between the opposite electrode and the hole transport layer and increases hole transport capability of an anode electrode, thereby improving the entire device characteristics.

The emission layer may be formed of 4,4'-bis(carbazol-9-yl)-biphenyl, etc. However, the present invention is not limited thereto.

The emission layer may further include a dopant capable of emitting light through electron-hole combination, similar to the hole transport layer. The kind and amount of the dopant may be substantially the same as the hole transport layer, and the emission layer may be formed to a thickness of 10-40 nm.

The electron transport layer may be formed of an electron transport material such as tris(8-quinolinolate)-aluminum ($Alq_3$), $Almq_3$, etc. The electron transport layer may further include a dopant capable of emitting light through electron-hole combination, similar to the hole transport layer. The kind and amount of the dopant may be substantially the same as the hole transport layer, and the electron transport layer may be formed to a thickness of 30-100 nm. When the electron transport layer is smaller or larger than 30-100 nm, the efficiency may be lowered and a driving voltage may be increased.

A Hole Blocking Layer (HBL) may be formed between the emission layer and the electron transport layer. The hole blocking layer functions to block movement of an exciton generated from a phosphorescent material to the electron transport layer or block movement of a hole to the electron transport layer. The hole blocking layer may be formed of BAlq.

The electron injection layer may be formed of a material, such as LiF, to have a thickness of 0.1-10 nm. When the electron injection layer is smaller or larger than 0.1-10 nm, a driving voltage may be increased.

The opposite electrode 294 formed on the organic layer may be a translucent cathode or may have a structure in which a transmissive cathode is deposited after forming the translucent cathode. The translucent cathode may be formed of Li, Ca, LiF/Ca, LiF/Al, Mg, or an Mg alloy to have a thickness of 5-30 nm. After forming the translucent cathode using a metal, such as Li, Ca, LiF/Ca, LiF/Al, Mg, or an Mg alloy having a low work function, an additional layer is formed of Indium Tin Oxide (ITO), Indium Zinc Oxide (IZO), etc., having low resistance characteristics, thereby forming the transmissive cathode. When the translucent cathode is thinner than 5 nm, an electron cannot be injected at a low voltage, and when the translucent cathode is thicker than 30 nm, transmissivity may be largely decreased. In addition, the entire thickness of the translucent cathode and the transmissive cathode may be 10-400 nm.

As can be seen from the foregoing, an OLED in accordance with the present invention includes second and third pixel electrodes formed in an opening of a pixel-defining layer exposing a certain region of a first pixel electrode using a shadow mask, thereby preventing exposure of the second electrode to strong acidic and strong basic chemicals used during etching, stripping and cleaning processes.

In addition, it is possible to prevent generation of a metal oxide layer between the first and second pixel electrodes due to oxidation of the second pixel electrode. Therefore, it is possible to prevent weakening of adhesion between the first and second pixel electrodes, thereby preventing peeling-off.

Although the present invention has been described with reference to certain exemplary embodiments thereof, it will be understood by those skilled in the art that a variety of modifications and variations may be made to the present invention without departing from the spirit or scope of the present invention as defined by the appended claims.

What is claimed is:

1. An Organic Light Emitting Display (OLED) comprising:
   a substrate;
   a first pixel electrode arranged on the substrate;
   a pixel-defining layer having an opening exposing a portion of a top surface of the first pixel electrode;
   a second pixel electrode arranged on the first pixel electrode exposed by the opening of the pixel-defining layer and arranged in the opening of the pixel-defining layer;

a third pixel electrode arranged on the second pixel electrode and arranged in the opening of the pixel-defining layer;
an organic layer arranged on the third pixel electrode and including an emission layer; and
an opposite electrode arranged on the organic layer.

2. The OLED according to claim 1, wherein the first pixel electrode comprises a material selected from a group consisting of Indium Tin Oxide (Ito), Indium Zinc Oxide (IZO), Tin Oxide (TO), and Zinc Oxide (ZnO).

3. The OLED according to claim 1, wherein the second pixel electrode comprises a material selected from a group consisting of Al, an Al alloy, Ag, and an Ag alloy.

4. The OLED according to claim 1, wherein the third pixel electrode comprises a material selected from a group consisting of Indium Tin Oxide (ITO), Indium Zinc Oxide (IZO), Tin Oxide (TO), and Zinc Oxide (ZnO).

5. The OLED according to claim 1, wherein the first pixel electrode has a thickness in a range of 50-100 Å.

6. The OLED according to claim 1, wherein the second pixel electrode has a thickness in a range of 900-2000 Å.

7. The OLED according to claim 1, wherein the third pixel electrode has a thickness in a range of 50-100 Å.

8. The OLED according to claim 1, wherein the pixel-defining layer comprises a material selected from a group consisting of benzocyclobutene (BCB), acryl-based photoresist, phenol-based photoresist, and polyimide-based photoresist.

9. An Organic Light Emitting Display (OLED) comprising:
a substrate;
a thin film transistor including a semiconductor layer having source and drain regions arranged on the substrate, and source and drain electrodes electrically connected to the semiconductor layer;
a first pixel electrode connected to one of the source and drain electrodes;
a pixel-defining layer having an opening exposing a portion of a top surface of the first pixel electrode;
a second pixel electrode arranged on the first pixel electrode exposed by the opening of the pixel-defining layer and arranged in the opening of the pixel-defining layer;
a third pixel electrode arranged on the second pixel electrode and arranged in the opening of the pixel-defining layer;
an organic layer arranged on the third pixel electrode and including an emission layer; and
an opposite electrode arranged on the organic layer.

10. The OLED according to claim 9, wherein the first pixel electrode comprises a material selected from a group consisting of Indium Tin Oxide (ITO), Indium Zinc Oxide (IZO), Tin Oxide (TO), and Zinc Oxide (ZnO).

11. The OLED according to claim 9, wherein the second pixel electrode comprises a material selected from a group consisting of Al, an Al alloy, Ag, and an Ag alloy.

12. The OLED according to claim 9, wherein the third pixel electrode comprises a material selected from a group consisting of Indium Tin Oxide (ITO), Indium Zinc Oxide (IZO), Tin Oxide (TO), and Zinc Oxide (ZnO).

13. The OLED according to claim 9, wherein the pixel-defining layer comprises a material selected from a group consisting of benzocyclobutene (BCB), acryl-based photoresist, phenol-based photoresist, and polyimide-based photoresist.

* * * * *